United States Patent
El-Tanani et al.

(10) Patent No.: US 9,418,783 B2
(45) Date of Patent: Aug. 16, 2016

(54) INDUCTOR DESIGN WITH METAL DUMMY FEATURES

(75) Inventors: Mohammed A. El-Tanani, Portland, OR (US); Jad B. Rizk, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/976,080

(22) PCT Filed: Dec. 29, 2011

(86) PCT No.: PCT/US2011/067923
§ 371 (c)(1),
(2), (4) Date: Mar. 25, 2014

(87) PCT Pub. No.: WO2013/101102
PCT Pub. Date: Jul. 4, 2013

(65) Prior Publication Data
US 2014/0197916 A1    Jul. 17, 2014

(51) Int. Cl.
*H01F 27/36* (2006.01)
*H01F 5/00* (2006.01)
(Continued)

(52) U.S. Cl.
CPC ........ *H01F 27/2804* (2013.01); *H01F 17/0006* (2013.01); *H01F 41/041* (2013.01);
(Continued)

(58) Field of Classification Search
CPC ............ H01F 17/0003; H01F 27/2804; H01F 27/292; H01F 27/027; H01F 27/2871; H01F 27/3629; H01F 27/362; H01F 41/041; H01F 41/046; H01F 29/025; H01F 29/02; H01F 29/04; H01F 21/12; H01F 27/2885; H01F 2017/0046; H01F 2017/0073; H01L 17/0006; H01L 23/522; H01L 23/5227; H01L 28/10; H01L 2924/0002; H01L 2924/00; Y10T 29/4902

USPC ............... 336/200, 232, 150, 84 C; 29/602.1
See application file for complete search history.

(56) References Cited

U.S. PATENT DOCUMENTS 5,959,522 A * 9/1999 Andrews ....................... 336/200
7,351,593 B1   4/2008 Johnson et al.
(Continued)

FOREIGN PATENT DOCUMENTS

KR  10-2010-0078877 A   7/2010
WO     2013/101102 A1   7/2013

OTHER PUBLICATIONS

International Search Report and Written Opinion received for PCT Patent Application No. PCT/US2011/067923, mailed on Jul. 31, 2012, 13 pages.
(Continued)

*Primary Examiner* — Mangtin Lian
(74) *Attorney, Agent, or Firm* — Finch & Maloney PLLC

(57) ABSTRACT

Techniques are disclosed for enhancing performance of integrated or on-chip inductors by implementing a schema of conductive metal dummies in the design thereof. In some cases, a metal dummy schema may be disposed in a layer proximate an upper surface of the inductor. The techniques may be implemented to improve overall inductor performance while enabling area scaling effects such as shrinking of inductor-to-inductor spacing on a die and/or increasing the quantity of inductors that may be manufactured on a die. In some cases, conductive metal dummies may be disposed in a region of minimal or non-peak magnetic field relative to the inductor, orthogonal to current flow in the inductor, and/or so as to minimize their occupation of the overall area of the inductor. The techniques may be implemented in analog circuits such as inductor-capacitor phase-locked loops (LC-PLLs), high-volume architectures, processor microarchitectures, applications involving stringent jitter requirements, microprocessor clocking, and wireless communication systems.

25 Claims, 6 Drawing Sheets

(51) Int. Cl.
*H01F 7/06* (2006.01)
*H01F 27/28* (2006.01)
*H01L 23/522* (2006.01)
*H01L 49/02* (2006.01)
*H01F 17/00* (2006.01)
*H01F 41/04* (2006.01)

(52) U.S. Cl.
CPC .......... *H01L23/522* (2013.01); *H01L 23/5227* (2013.01); *H01L 28/10* (2013.01); *H01F 2017/0046* (2013.01); *H01F 2017/0073* (2013.01); *H01L 2924/0002* (2013.01); *Y10T 29/4902* (2015.01)

(56) References Cited

U.S. PATENT DOCUMENTS

| | | | |
|---|---|---|---|
| 2002/0096736 A1* | 7/2002 | Brennan et al. | 257/531 |
| 2002/0158306 A1 | 10/2002 | Niitsu | |
| 2003/0210122 A1* | 11/2003 | Concord et al. | 336/200 |
| 2007/0052062 A1* | 3/2007 | Ding et al. | 257/528 |
| 2008/0277773 A1 | 11/2008 | Kim et al. | |
| 2010/0289610 A1* | 11/2010 | Jacobson et al. | 336/84 C |
| 2013/0049919 A1* | 2/2013 | Cho | 336/84 C |

OTHER PUBLICATIONS

International Preliminary Report on Patentability for Application No. PCT/US2011/067923, mailed on Jul. 10, 2014, 9 pages.

* cited by examiner

INDUCTOR DESIGN WITH METAL DUMMY FEATURES

BACKGROUND

Integrated circuit design in the deep-submicron process nodes (e.g., 32 nm and beyond) involves a number of non-trivial challenges, and circuits incorporating microelectronic components such as inductors have faced particular complications at these levels, such as those with respect to optimal device parameters and circuit performance. Continued process scaling will tend to exacerbate such problems.

DETAILED DESCRIPTION

Figure 1:
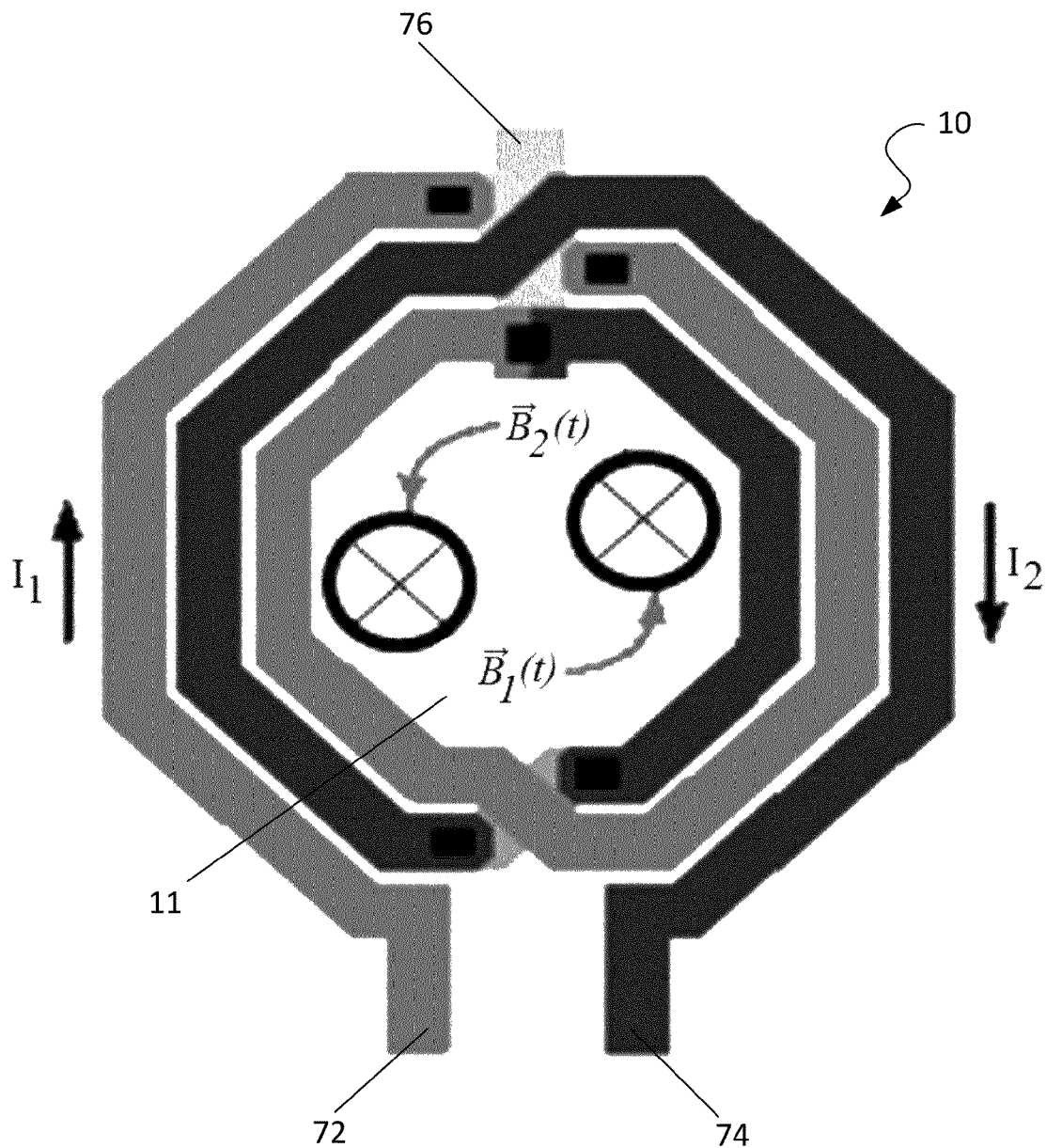
FIG. 1 schematically illustrates magnetic field orientation for differential excitation of a symmetrical inductor.

Techniques are disclosed for enhancing performance of integrated or on-chip inductors by implementing a schema of conductive metal dummies in the design thereof. In some cases, a metal dummy schema, configured in accordance with an embodiment of the invention, may be disposed in a layer proximate an upper surface of the inductor. The techniques may be implemented to improve overall inductor performance while enabling, for example, area scaling effects such as shrinking of inductor-to-inductor spacing on a die and/or increasing the quantity of inductors that may be manufactured on a die. In some example embodiments, the conductive metal dummies may be disposed in a region of minimal or non-peak magnetic field relative to the inductor, orthogonal to current flow in the inductor, and/or so as to minimize their occupation of the overall area of the inductor. The techniques may be implemented, for instance, in analog circuits such as inductor-capacitor phase-locked loops (LC-PLLs), processor microarchitectures, circuitry involving stringent to jitter requirements, clocking and delay circuits, and any other inductor-based circuitry.

General Overview

Conventional integrated inductor designs are associated with a number of non-trivial issues. For instance, with conventional approaches, pieces of conductive metal (dummies) are used only below the lower metal layers of inductors in integrated circuits (ICs). However, these dummies tend to be very small (e.g., less than 1 µm in length) and do not drastically affect overall inductor performance. Also, in an attempt to maintain good inductor performance, conventional approaches typically refrain from placing any metal at all on top of the inductor's metal layer (i.e., a void is placed in a layer on top of the inductor's metal layer). However, this approach imposes two stringent manufacturing limitations on IC design. First, the inductor-to-inductor spacing (i.e., the distance between inductors on a die) is affected in that, due to the resulting low density of the voided metal layer, multiple LC-PLLs cannot be placed proximate one another. Second, and as a result of the aforementioned spacing limitation, the total number of inductors capable of being manufactured on a die is limited.

With a given inductor that has conductive metal pieces proximately disposed in accordance with an embodiment of the present invention, circulating eddy currents may be induced in those conductive metal pieces as a result of the magnetic field produced by the inductor. As will be appreciated, these circulating eddy currents have their own associated inductance and thus induce a magnetic field, which in turn counteracts or otherwise interferes with the magnetic field of the associated inductor, diminishing its inductance (L). Also, such eddy currents cause power to be dissipated in the conductive metal dummies, resulting in reduced inductor quality factor (Q). Furthermore, as will be appreciated, the magnitude of the eddy currents is proportional to the magnitude of the magnetic field of the associated inductor. Therefore, as the magnetic field of the inductor is increased, greater eddy currents are formed in the metal dummies, which in turn have correspondingly stronger induced magnetic fields, which in turn counteract the inductor's magnetic field, further degrading the inductor's performance (i.e., inductance and/or quality factor).

Thus, and in accordance with an embodiment of the present invention, a schema of metal dummy features may be disposed in a layer proximate the upper surface of an inductor. Embodiments of the present invention can be used to eliminate or otherwise mitigate degradation in inductor performance. In some instances, embodiments of the present invention may be used to minimize/eliminate manufacturing requirements and/or restrictions associated with the distance between and/or the number of inductors or inductor-based devices in a given application.

In accordance with an embodiment of the present invention, several factors may be considered in implementing a given metal dummy schema to minimize or otherwise moderate interference with inductor performance. First, inductor performance may be improved by minimally disposing the metal dummies proximate areas of the inductor where the magnetic field is the highest. Otherwise put, placement of the metal dummies in regions where the magnetic field of the inductor is at a minimum or otherwise lower than peak/maximum (highest) magnetic flux may improve inductor performance. Second, inductor performance may be improved by placing the metal dummies substantially orthogonal to current flow within the inductor (the eddy current generated can be forced to be orthogonal to the current in the inductor and thus the metal dummy longitude is orthogonal to the inductor coil). Third, inductor performance may be improved by placing the metal dummies so as to minimize their occupation of the overall area of the inductor. In various embodiments, a metal dummy schema fulfilling one or more or all of these conditions may minimally degrade inductor performance. For example, in some embodiments, a metal dummy schema fulfilling one or more or all of these conditions may allow for area scaling effects such as shrinking the distance/spacing between inductors and/or inductor-based devices (e.g., LC-PLLs) formed on a die and/or maximizing the quantity of inductors and/or inductor-based devices (e.g., LC-PLLs) that may be formed on a die.

Metal Dummy Schema

FIG. 1 schematically illustrates magnetic field orientation for differential excitation of a symmetrical inductor coil 10. In this example, an excitation current $I_1$ is applied to a first portion of the coil 10, while an excitation current $I_2$ is applied to a second portion of the coil 10. As will be appreciated, a resultant magnetic field $B_1(t)$ is generated by excitation current $I_1$, and a resultant magnetic field $B_2(t)$ similarly is generated by excitation current $I_2$. Due to the symmetry of inductor coil 10 and the differential excitation thereof (via application of differential voltages at terminals 72 and 74, for example), magnetic fields $B_1(t)$ and $B_2(t)$ add together in phase within central region 11 of inductor 10. Consequently, the magnetic field of inductor 10 is strongest (and the magnetic flux therethrough is highest) in central region 11. Therefore, as previously explained, and in accordance with an embodiment of the present invention, disposing one or more minimum-area and/or minimum-density metal dummies in a layer proximate this central region 11 of inductor 10 may be desirable to improve performance of inductor 10. These principles are explored in further detail below with reference to FIGS. 2 and 3.

In some cases, inductor 10 may include an optional terminal 76. In some such cases, the AC voltage at such optional terminal 76 may be measured as zero (as a result of the symmetry and/or differential excitation of the inductor coil 10). Thus, in some such cases, operatively coupling a resistor or other electronic device with optional terminal 76 may have minimal or no effect on the overall performance of inductor 10. Therefore, in some instances, it may be desirable to operatively couple, for example, a DC voltage source (not shown) to optional terminal 76 to provide biasing within inductor 10, in accordance with some embodiments.

Figure 2:
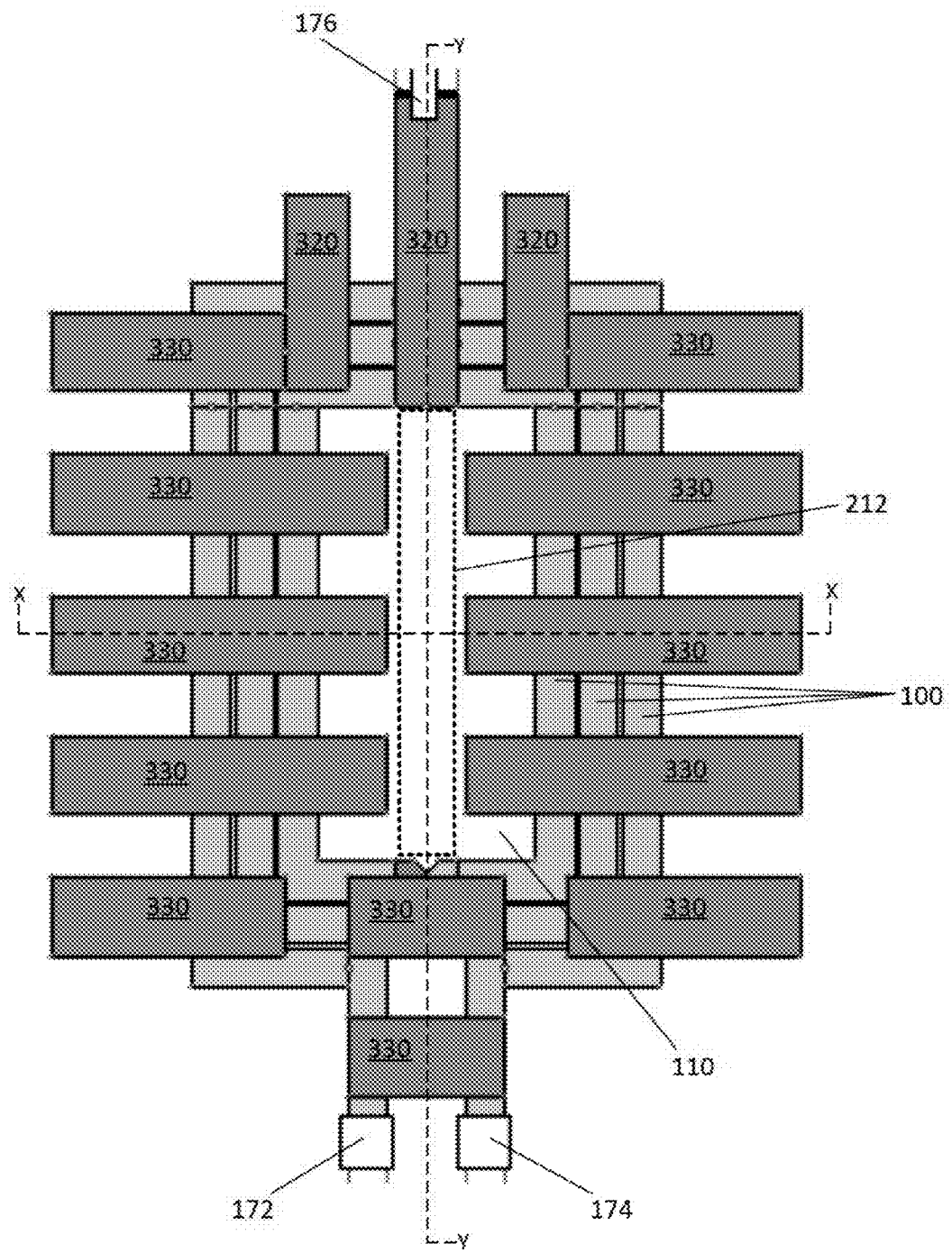
FIG. 2 illustrates a top-down view of an inductor coil employing a metal dummy schema, configured in accordance with an embodiment of the present invention.

FIG. 2 illustrates a top-down view of an inductor coil 100 employing a metal dummy schema, configured in accordance with an embodiment of the present invention. As can be seen, the example metal dummy schema includes several longitudinally-oriented conductive metal dummies 320 and several transversely-oriented conductive metal dummies 330, all of which have been disposed in a layer proximate an upper surface of inductor 100. The coil 100 itself can be implemented as conventionally done. In some embodiments, one or more metal dummies 320 and/or 330 may be a conductive metal such as, but not limited to, copper, aluminum, silver, nickel, gold, titanium, indium, tungsten, alloys thereof, or other suitably conductive metal. In some embodiments, one or more metal dummies 320 and/or 330 may be of any given dimensions suitable for a given application but otherwise provisioned as described herein. As will be appreciated in light of this disclosure, the geometry of metal dummies 320 and/or 330 can vary from one application to the next, depending on factors such as process node and desired circuit performance. In some example cases, metal dummies 320 and/or 330 are implemented in the micrometer range (e.g., having an area in the range of about 50-500 $\mu m^2$), and in some specific example embodiments may have at least one dimension (e.g., x-, y-, and/or z-axis) in the range of about 10-40 $\mu m$ (e.g., having an area greater than or equal to about 200 $\mu m^2$). In short, metal dummies 320 and/or 330 can have any desired dimensions suitable for a given process node and application and may otherwise be implemented in accordance with an embodiment of the present invention. The claimed invention is not intended to be limited to any particular metal dummy geometry.

In one or more embodiments of the present invention, metal dummies 320 and/or 330 may be disposed in a layer proximate an upper surface of an inductor 100 by any suitable method or means for doing so, including, but not limited to, electroless deposition, electroplating, chemical deposition processes, physical deposition process, etc., in some embodiments.

Figure 3:
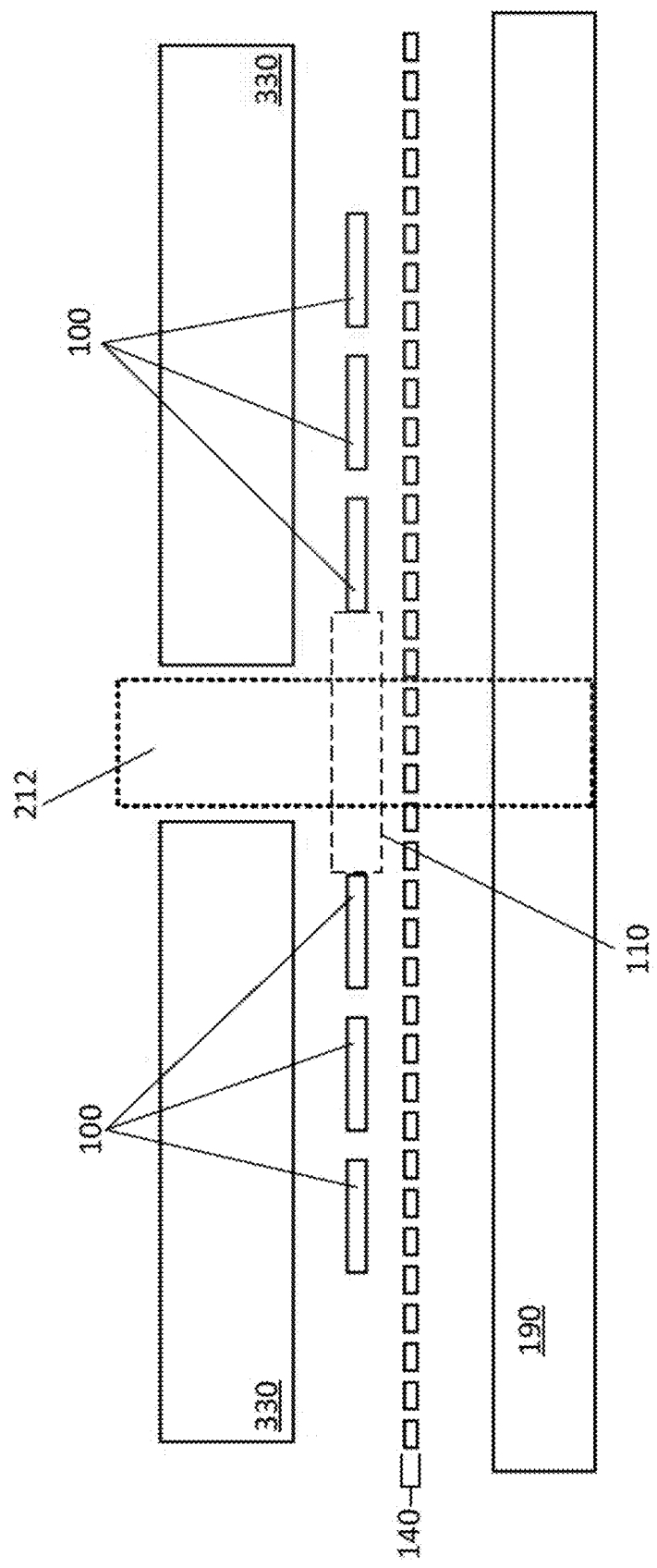
FIG. 3 illustrates a cross-section view of the inductor coil of FIG. 2 taken along dashed line X-X therein, configured in accordance with an embodiment of the present invention.

FIG. 3 illustrates a cross-section view of the inductor coil 100 of FIG. 2 taken along dashed line X-X therein, configured in accordance with an embodiment of the present invention. As can be seen, metal dummies 330 (and 320, not visible in this cross-section) are disposed in a layer proximate the upper surface of inductor 100. In one or more embodiments, an insulator material, for example, may be disposed: (1) between inductor 100 and the layer of metal dummies 330 and 320; (2) between inductor 100 and lower metal layer 140; (3) and/or between substrate 190 and lower metal layer 140. In some instances, the insulator material may be, for example, an electrically insulating polymer, an electrically insulating ceramic, and/or a dielectric material. In some specific embodiments, an inductor 100 may be disposed proximate a lower metal layer 140 of conductive metal pieces that have a tighter pitch (area miniaturization) as compared to the layer of metal dummies 320 and/or 330 disposed proximately above inductor 100. The spacing between the layers can vary as well, but in some example cases, the metal dummies 320 and/or 330 are within about 5 nm-5 $\mu m$ of inductor 100. In a more general sense, any spacing can be used that allows for the desired inductor performance.

Substrate 190 may be a semiconductor wafer or other suitable substrate. In some example embodiments, substrate 190 may be, for instance, a metal, silicon, germanium, III-V material, oxide, nitride, or combinations thereof. In some cases, the wafer/substrate may be configured, for example, as a bulk substrate, a semiconductor-on-insulator (XOI, where X is a semiconductor material such as silicon, germanium, or germanium-enriched silicon), or a multi-layered structure. Other suitable materials and/or configurations for substrate 190 will be apparent in light of this disclosure.

Lower metal layer 140 may be implemented as conventionally done, using a conductive metal such as, but not limited to, copper, aluminum, silver, nickel, gold, titanium, indium, tungsten, alloys thereof, or other suitably conductive metal. In some example instances, lower metal layer 140 may be made of the same material as metal dummies 320 and/or 330. In some cases, pieces of lower metal layer 140 may have a tighter pitch (area miniaturization) as compared to metal dummies 320 and/or 330. In some example cases, lower metal layer 140 may be implemented in the micrometer range (e.g., x-, y-, and/or z-axis in the range of about 1 $\mu m$ or less). Other suitable materials, geometries, and/or configurations for lower metal layer 140 will be apparent in light of this disclosure, and the claimed invention is not intended to be limited to any particular metal layer 140 configuration.

When inductor 100 is subjected to differential excitation (via application of differential voltages at terminals 172 and 174, for example), corresponding magnetic fields (like $B_1(t)$ and $B_2(t)$ in discussed above with reference to FIG. 1) are generated and add together in phase in central region 110 (the strongest magnetic field region) of inductor 100. Similar to the discussion above with reference to FIG. 1, optional terminal 176 (if included) may be operatively coupled, for example, with a DC voltage source to provide biasing within inductor 100, as desired in a given application. As will be appreciated, as the generated magnetic fields change (e.g., due to variations of the fields in time), varying eddy currents are induced in conductive metal dummies 320 and/or 330. These circulating eddy currents have their own associated inductance and thus induce a multitude of localized magnetic fields emanating from metal dummies 320 and/or 330, which counteract or otherwise degrade the magnetic field generated by inductor 100.

As can be seen from the depicted example schema of FIGS. 2 and 3, metal dummies 320 and 330 have been disposed in a layer proximate the upper surface of inductor 100 in accordance with an embodiment of the present invention. In the depicted example case, metal dummies 320 and 330 have been minimally disposed where the magnetic field of inductor 100 is highest, such as maximum magnetic flux zone 212. In some example embodiments, maximum magnetic flux zone 212 may be defined as the region where the amplitude of the magnetic field experienced is some arbitrary percentage (e.g., greater than or equal to about 75-100%) of the maximum/peak amplitude of the magnetic field. In the depicted example case, metal dummies 320 and 330 have been disposed such that they do not extend into or otherwise occupy maximum magnetic flux zone 212. However, in other example embodiments, one or more of metal dummies 320 and/or 330 may be disposed such that some percentage (e.g., less than or equal to about 30%) of their volume (individual or collective) is permitted to extend into maximum magnetic flux zone 212. Other percentages suitable for a given application will be apparent in light of this disclosure.

As can further be seen from the depicted example schema of FIGS. 2 and 3, metal dummies 320 and 330 have been disposed in selected orientations that are substantially orthogonal to current flow within inductor 100. Still further, metal dummies 320 and 330 have been disposed so as to minimize their occupation of the overall area of inductor 100. For instance, in some example embodiments, metal dummies 320 and 330 may be disposed so as to cover less than 60% (e.g., 20-50%) of the total surface area of inductor 100. Other percentages of coverage suitable for a given application will be apparent in light of this disclosure.

As a result of implementing the example metal dummy schema of FIGS. 2 and 3, or any other example metal dummy schema configured in accordance with an embodiment of the present invention, the inductance (L) and/or quality factor (Q) of inductor 100 may be improved (e.g., minimally or otherwise acceptably degraded) while simultaneously achieving, for example, area scaling effects such as shrinking the distance/spacing between inductors and/or inductor-based devices (e.g., LC-PLLs) formed on a die and/or maximizing the quantity of inductors and/or inductor-based devices (e.g., LC-PLLs) that may be formed on a die.

In accordance with one or more embodiments of the present invention, eddy currents induced in metal dummies 320 and/or 330 may be further reduced/mitigated (and inductor performance consequently improved) by: (1) further reducing the presence of metal dummies 320 and/or 330 in/near maximum magnetic flux zone 212 of inductor 100; (2) further making metal dummies 320 and/or 330 be orthogonal to current flowing through inductor 100 with a greater degree of precision; and/or (3) further reducing the dimension(s), area, volume, density, and/or physical presence of metal dummies 320 and/or 330. In some such cases, the performance (e.g., inductance and/or quality factor) of inductor 100 may be improved as a result, in accordance with an embodiment of the present invention.

Other considerations—for example, desired device performance characteristics or manufacturing/design requirements—may impose limitations/restrictions on the design of a given inductor or inductor-based device. As will be appreciated in light of this disclosure, FIGS. 2 and 3 are provided merely to show an example metal dummy schema, configured in accordance with an embodiment of the present invention.

As will be appreciated, numerous additional metal dummy schemas configured in accordance with other embodiments are possible, and a given application may govern how and to what extent the disclosed techniques may be implemented in accordance with a given embodiment.

Simulated Implementation Data

Figure 4:
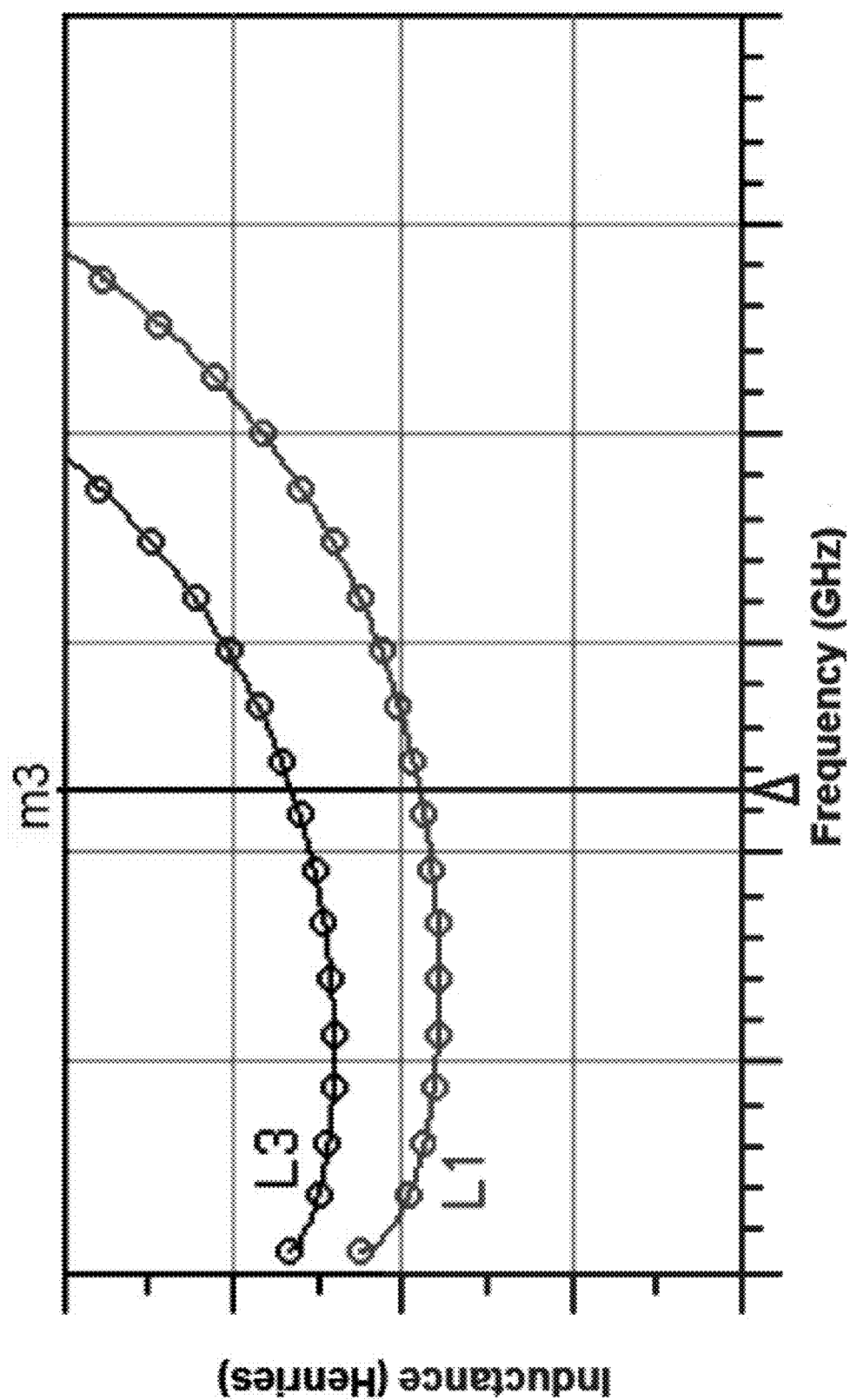
FIG. 4 illustrates a graph of simulated data for a given process node showing inductance (L) as a function of frequency for an example inductor configured in accordance with an embodiment of the present invention.

FIG. 4 illustrates a graph of simulated data for a given process node showing inductance (L) as a function of frequency for an example inductor configured in accordance with an embodiment of the present invention. Curve #L1 represents inductance of a conventional inductor employing small and large metal dummies disposed in the middle of and around the inductor in a layer below the inductor. Curve #L3 represents inductance of an inductor implementing a metal dummy schema in a layer above the inductor and a layer of small metal dummies (of tighter pitch than the metal dummies above the inductor) below the inductor, in accordance with an example embodiment of the present invention, such as that discussed above with reference to FIGS. 2 and 3. As can be seen in from the plots, inductance was improved by implementing a metal dummy schema, configured in accordance with an example embodiment, as compared to the conventional inductor design employing only small metal dummies in a layer below the inductor. Measurements observed at the frequency value identified by line m3 demonstrate that an approximately 19% improvement in inductance over the conventional inductor was achieved via implementation of a metal dummy schema in the design of an inductor configured in accordance with an embodiment of the present invention. An example frequency range of operation is 1-30 GHz (e.g., 10 GHz), although inductors described herein generally can be used in any desired frequency range.

Figure 5:
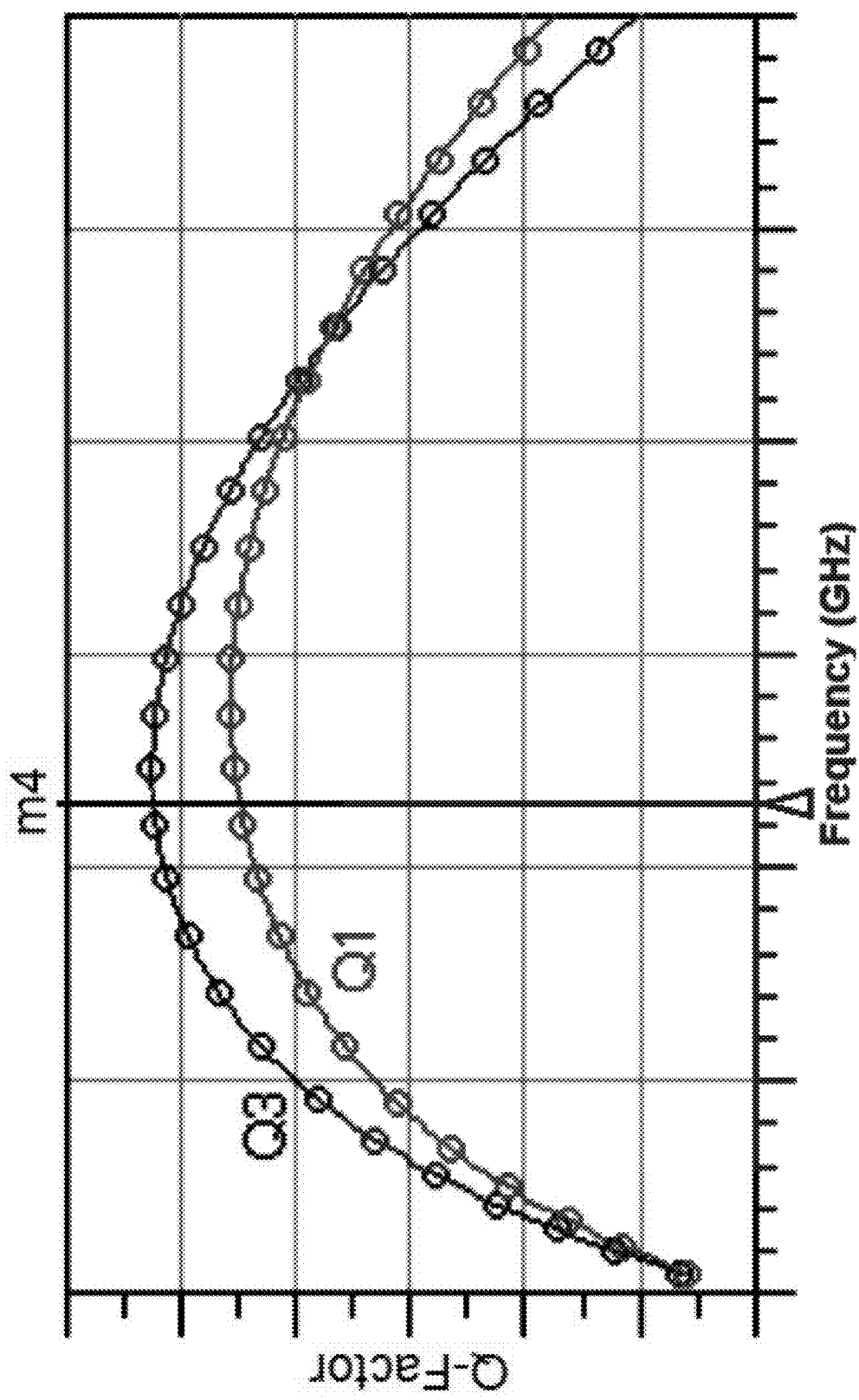
FIG. 5 illustrates a graph of simulated data for a given process node showing quality factor (Q) as a function of frequency for an example inductor configured in accordance with an embodiment of the present invention.

FIG. 5 illustrates a graph of simulated data for a given process node showing quality factor (Q) as a function of frequency for an example inductor configured in accordance with an embodiment of the present invention. Quality factor, as used herein, is a unitless measure denoting the ratio of an inductor's inductive reactance to its resistance at a given frequency, and is thus a measure of the inductor's efficiency. The higher the Q of a given inductor, the more closely it behaves like an ideal, lossless inductor. Curve #Q1 represents the quality factor of a conventional inductor employing small and large metal dummies disposed in the middle of and around the inductor in a layer below the inductor. Curve #Q3 represents the quality factor of an inductor implementing a metal dummy schema in a layer above the inductor and a layer of small metal dummies (of tighter pitch than the metal dummies above the inductor) below the inductor, in accordance with an example embodiment of the present invention, such as that discussed above with reference to FIGS. 2 and 3. As can be seen from the plots, quality factor was improved by implementing a metal dummy schema, configured in accordance with an example embodiment, as compared to the conventional inductor design employing only small metal dummies in a layer below the inductor. Measurements observed at the frequency value identified by line m4 (the same frequency as indicated by line m3 in FIG. 4) demonstrate that an approximately 15% improvement in quality factor over the conventional inductor was achieved via implementation of a metal dummy schema in the design of an inductor configured in accordance with an embodiment of the present invention.

Furthermore, measurements observed at the frequency value identified by lines m3 and m4 demonstrate that an approximately 25% improvement in jitter over the conventional inductor was achieved via implementation of a metal dummy schema in the design of an inductor configured in accordance with an embodiment of the present invention.

In various embodiments, one or more of the disclosed techniques may be used to implement various integrated circuit structures/devices (e.g., inductors and inductor-based technologies) that may be manufactured as discrete components or on-chip and at, for example, the deep-submicron process levels/nodes, including the 45 nm process node and beyond (e.g., 32 nm, 22 nm, 16 nm, 14 nm, and beyond). Such structures/devices can be used in any number of electronic systems, as will be apparent in light of this disclosure.

Example System

Figure 6:
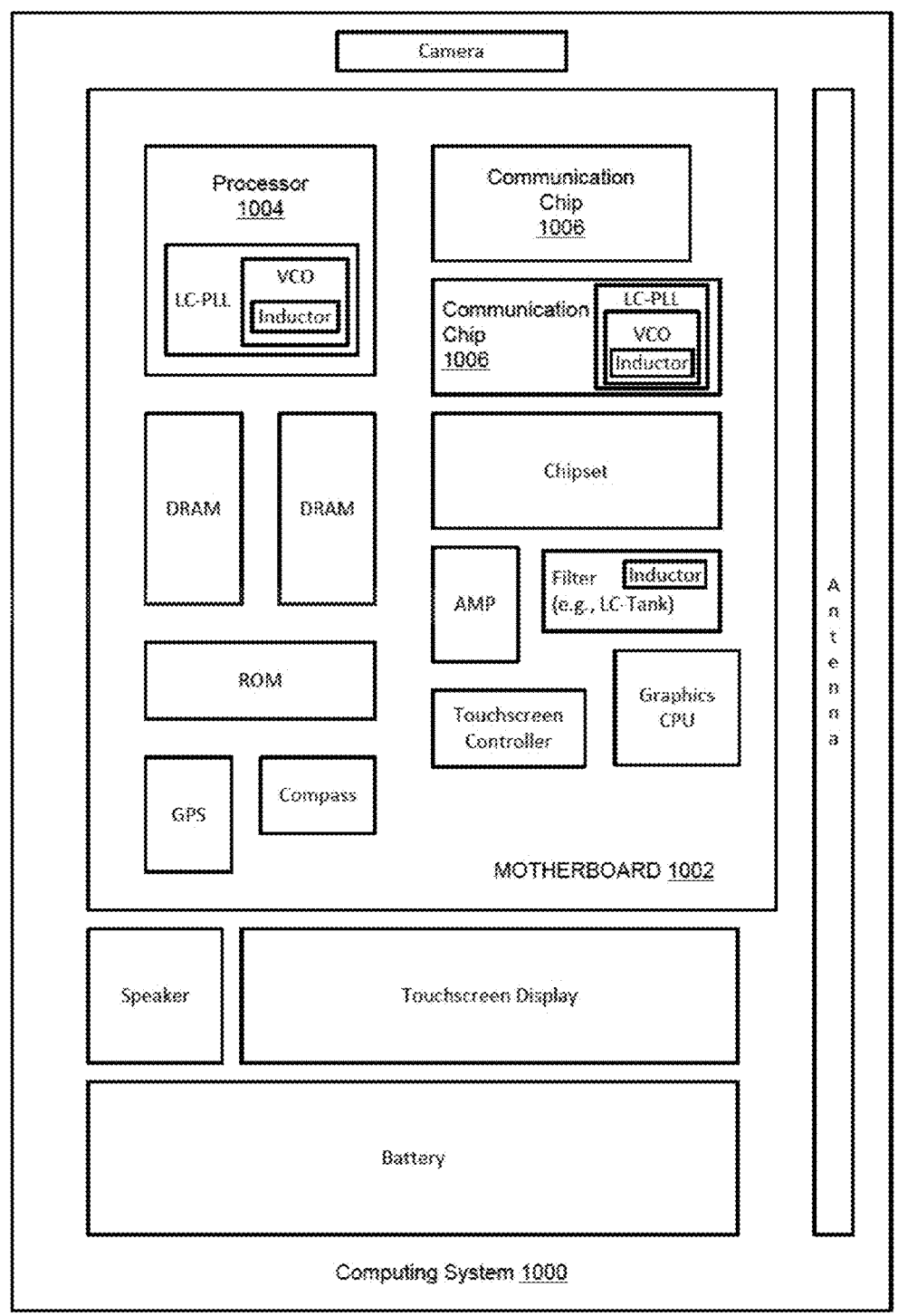
FIG. 6 illustrates a computing system implemented with one or more inductors configured in accordance with an embodiment of the present invention.

FIG. 6 illustrates a computing system 1000 implemented with one or more inductors configured in accordance with an embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, one or more filters (e.g., LC-tank, high-pass, low-pass, bandpass filters), a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more inductors configured as described herein. These inductors can be used, for instance, to implement a voltage controlled oscillator or amplifier circuit. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard LC-PLL circuitry that includes a VCO configured with an inductor, such as those described herein, to provide a variable capacitance to the LC-tank circuit and/or other typical or otherwise desired processor circuitry (e.g., amplifier, DAC, high-speed interconnect) that is implemented with one or more inductors as described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more devices implemented with one or more inductors as described herein (e.g., on-chip LC-PLL having a VCO configured with an inductor and/or other on-chip circuitry suitable for inductor-based technology). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a in notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs inductors and/or inductor-based devices.

Numerous embodiments will be apparent, and features described herein can be combined in any number of configurations. One example embodiment of the present invention provides an integrated circuit. The circuit includes a substrate, an inductor disposed in or on the substrate, a first plurality of conductive metal pieces disposed below the inductor and proximate a lower surface of the inductor, and a second plurality of conductive metal pieces disposed above the inductor and proximate an upper surface of the inductor, wherein the first plurality of conductive metal pieces has a tighter pitch than the second plurality of conductive metal pieces. In some cases, the circuit includes at least one of a first layer of insulating material disposed between the substrate and the first plurality of conductive metal pieces, a second layer of insulating material disposed between the first plurality of conductive metal pieces and the inductor, and a third layer of insulating material disposed between the inductor and the second plurality of conductive metal pieces. In some cases, the insulating material is selected from the group consisting of electrically insulating polymers, electrically insulating ceramics, and dielectric materials. In some cases, the insulating material is the same for each of the first, second, and third layers of insulating material. In some cases, the conductive metal is chosen from the group consisting of copper, aluminum, silver, nickel, gold, titanium, indium, tungsten, and alloys thereof. In some cases, the conductive metal is the same for each of the first plurality and second plurality of conductive metal pieces. In some cases, the metal pieces of the first plurality are less than 1 µm in at least one dimension, and the metal pieces of the second plurality are greater than 1 µm in at least one dimension. In some cases, at least one piece of the second plurality of conductive metal pieces has an area greater than or equal to about 200 µm². In some cases, the inductor has a magnetic field and maximum magnetic flux zone, and the amplitude of the magnetic field within that zone is greater than or equal to about 75% of a maximum magnetic field generated by the inductor. In some cases, less than about 30% by volume of the second plurality of conductive metal pieces is present in the maximum magnetic flux zone. In some cases, the second plurality of conductive metal pieces is not present in the maximum magnetic flux zone. In some cases, the second plurality of conductive metal pieces is disposed orthogonal to current flow in the inductor. In some cases, the second plurality of conductive metal pieces covers less than 60% of the upper surface of the inductor. In some cases, the inductor is operatively coupled to a differential excitation source. In some cases, the inductor is operatively coupled to a biasing source. In some cases, the circuit is implemented at a process node of about 45 nm or smaller. In some cases, an electronic device includes one or more of the integrated circuit. In some such cases, the electronic device includes at least one of a memory circuit, a communication chip, a processor, and/or a computing system.

Another embodiment of the present invention provides an integrated inductor device. The device includes a substrate, an inductor disposed in or on the substrate, wherein the inductor has a region of maximum magnetic flux, a first plurality of copper pieces disposed below the inductor and proximate a lower surface of the inductor, wherein the pieces have a dimension that is less than or equal to about 1 µm, and a second plurality of copper pieces disposed above the inductor and proximate an upper surface of the inductor, wherein the pieces have a dimension that is greater than or equal to about 10 µm, wherein less than about 30% by volume of the second plurality of copper pieces is present in the region of maximum magnetic flux. In some cases, the device includes a dielectric material disposed between at least one of the substrate and the first plurality of copper pieces, the first plurality of copper pieces and the inductor, and/or the inductor and the second plurality of copper pieces. In some cases, an inductor-capacitor phase-locked loop device includes the inductor device. In some cases, a microprocessor includes the inductor device.

Another embodiment of the present invention provides a method of fabricating an integrated inductor device. The method includes providing a substrate, providing an inductor disposed in or on the substrate, providing a first plurality of conductive metal pieces disposed below the inductor and proximate a lower surface of the inductor, and providing a second plurality of conductive metal pieces disposed above the inductor and proximate an upper surface of the inductor, wherein the first plurality of conductive metal pieces has a tighter pitch than the second plurality of conductive metal pieces. In some cases, the method includes providing an insulating material disposed between at least one of the substrate and the first plurality of conductive metal pieces, the first plurality of conductive metal pieces and the inductor, and/or the inductor and the second plurality of conductive metal pieces. In some cases, the insulating material is selected from the group consisting of electrically insulating polymers, electrically insulating ceramics, and dielectric materials. In some cases, the conductive metal is chosen from the group consisting of copper, aluminum, silver, nickel, gold, titanium, indium, tungsten, and alloys thereof.

The foregoing description of example embodiments of the invention has been presented for in the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. An integrated circuit comprising:
   a substrate;
   an inductor disposed over the substrate;
   a first plurality of conductive metal pieces disposed below the inductor and proximate a lower surface of the inductor, wherein the first plurality of conductive metal pieces include at least one conductive metal piece having a first thickness between top and bottom surfaces thereof; and
   a second plurality of conductive metal pieces disposed above the inductor and proximate an upper surface of the inductor, wherein the second plurality of conductive metal pieces include at least one conductive metal piece having a second thickness between top and bottom surfaces thereof, wherein the second thickness is greater than the first thickness;
   wherein the first plurality of conductive metal pieces has a tighter pitch than the second plurality of conductive metal pieces.

2. The integrated circuit of claim 1 further comprising insulating material disposed between at least one of:
   the substrate and the first plurality of conductive metal pieces;
   the first plurality of conductive metal pieces and the inductor; and
   the inductor and the second plurality of conductive metal pieces.

3. The integrated circuit of claim 2, wherein the insulating material comprises at least one of an electrically insulating polymer, an electrically insulating ceramic, and a dielectric material.

4. The integrated circuit of claim 2, wherein at least one piece of the second plurality of conductive metal pieces has an area in the range of about 50-500 µm².

5. The integrated circuit of claim 1, wherein at least one piece of the first and second pluralities of conductive metal pieces comprises at least one of copper, aluminum, silver, nickel, gold, titanium, indium, tungsten, and alloys thereof.

6. The integrated circuit of claim 1, wherein at least one piece of the second plurality of conductive metal pieces has at least one dimension in the range of about 10-40 µm.

7. The integrated circuit of claim 1, wherein the metal pieces of the first plurality are less than 1 µm in at least one dimension, and the metal pieces of the second plurality are greater than 1 µm in at least one dimension.

8. The integrated circuit of claim 1, wherein at least one piece of the second plurality of conductive metal pieces has an area greater than or equal to about 200 µm².

9. The integrated circuit of claim 1, wherein the inductor has a magnetic field and a maximum magnetic flux zone, and the amplitude of the magnetic field within that maximum magnetic flux zone is greater than or equal to about 75% of a maximum magnetic field generated by the inductor.

10. The integrated circuit of claim 9, wherein less than about 30% by volume of the second plurality of conductive metal pieces is present in the maximum magnetic flux zone of the inductor.

11. The integrated circuit of claim 9, wherein the second plurality of conductive metal pieces is not present in the maximum magnetic flux zone of the inductor.

12. The integrated circuit of claim 1, wherein the second plurality of conductive metal pieces is disposed orthogonal to current flow in the inductor.

13. The integrated circuit of claim 1, wherein the second plurality of conductive metal pieces covers less than 60% of the upper surface of the inductor.

14. The integrated circuit of claim 1, wherein the inductor is operatively coupled to at least one of a differential excitation source and a biasing source.

15. The integrated circuit of claim 1, wherein at least one of the first and second pluralities of conductive metal pieces is located at a distance in the range of about 5 nm-5 µm from the inductor.

16. An electronic device comprising one or more of the integrated circuit of claim 1.

17. The electronic device of claim 16, wherein the electronic device comprises at least one of a memory circuit, a communication chip, a processor, and a computing system.

18. An integrated inductor device comprising:
a substrate;
an inductor disposed over the substrate, wherein the inductor has a region of maximum magnetic flux;
a first plurality of copper pieces disposed below the inductor and proximate a lower surface of the inductor, wherein each of the pieces has a top surface and a bottom surface separated by a plurality of sides, each piece further having at least one of:
  a thickness between the top and bottom surfaces that is less than or equal to about 1 µm; and
  a width that is less than or equal to about 1 µm; and
a second plurality of copper pieces disposed above the inductor and proximate an upper surface of the inductor, wherein each of the pieces has a top surface and a bottom surface separated by a plurality of sides, each piece further having at least one of:
  a thickness between the top and bottom surfaces that is greater than or equal to about 10 µm; and
  a width that is greater than or equal to about 10 µm;
wherein less than about 30% by volume of the second plurality of copper pieces is present in the region of maximum magnetic flux of the inductor.

19. The integrated inductor device of claim 18 further comprising a dielectric material disposed between at least one of:
the substrate and the first plurality of copper pieces;
the first plurality of copper pieces and the inductor; and
the inductor and the second plurality of copper pieces.

20. An inductor-capacitor phase-locked loop (LC-PLL) device comprising the integrated inductor device of claim 18.

21. A microprocessor comprising the integrated inductor device of claim 18.

22. A method of fabricating an integrated inductor device comprising:
providing a substrate;
providing an inductor disposed over the substrate;
providing a first plurality of conductive metal pieces disposed below the inductor and proximate a lower surface of the inductor; and
providing a second plurality of conductive metal pieces disposed above the inductor and proximate an upper surface of the inductor;
wherein:
  the first plurality of conductive metal pieces has a tighter pitch than the second plurality of conductive metal pieces;
  each of the conductive metal pieces from the first and second pluralities has top and bottom surfaces separated by a plurality of sides and a thickness between the top and bottom surfaces; and
  the thickness of at least one conductive metal piece of the second plurality of conductive metal pieces is greater than the thickness of at least one conductive metal piece of the first plurality of conductive metal pieces.

23. The method of claim 22 further comprising:
providing an insulating material disposed between at least one of:
the substrate and the first plurality of conductive metal pieces;
the first plurality of conductive metal pieces and the inductor; and
the inductor and the second plurality of conductive metal pieces.

24. The method of claim 22, wherein the insulating material comprises at least one of an electrically insulating polymer, an electrically insulating ceramic, and a dielectric material.

25. The method of claim 22, wherein at least one of the first and second pluralities of conductive metal pieces comprises at least one of copper, aluminum, silver, nickel, gold, titanium, indium, tungsten, and alloys thereof.

* * * * *